(12) United States Patent  (10) Patent No.: US 8,587,041 B2
Mochizuki et al.  (45) Date of Patent: Nov. 19, 2013

(54) SOLID-STATE IMAGING DEVICE AND METHOD OF MANUFACTURING THE SAME

(75) Inventors: Ai Mochizuki, Yokohama (JP); Takeshi Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 13/235,414

(22) Filed: Sep. 18, 2011

(65) Prior Publication Data

US 2012/0119271 A1 May 17, 2012

(30) Foreign Application Priority Data

Nov. 11, 2010 (JP) ................................. 2010-252905

(51) Int. Cl.
*H01L 21/336* (2006.01)

(52) U.S. Cl.
USPC ........... 257/292; 257/288; 257/462; 257/293; 257/E21.042; 257/E21.053; 257/E21.058; 257/E21.248; 257/E21.352; 257/E21.37; 257/E21.499; 257/E21.527

(58) Field of Classification Search
USPC ......... 257/288, 292, 293, 462, 431, 432, 678, 257/E21.042, E21.053, E21.058, E21.231, 257/E21.248, E21.352, E21.37, E21.499, 257/E21.527

See application file for complete search history.

(56) References Cited

U.S. PATENT DOCUMENTS

| 8,067,261 | B2 * | 11/2011 | Itonaga | 438/69 |
| 8,072,015 | B2 * | 12/2011 | Itonaga | 257/294 |
| 2011/0073923 | A1 * | 3/2011 | Tatani et al. | 257/291 |
| 2012/0112254 | A1 * | 5/2012 | Nagano | 257/292 |

FOREIGN PATENT DOCUMENTS

| JP | 7-302891 | 11/1995 |
| JP | 2005-136279 | 5/2005 |
| JP | 2009-16826 | 1/2009 |

* cited by examiner

*Primary Examiner* — David Nhu
(74) *Attorney, Agent, or Firm* — Oblon, Spivak, McClelland, Maier & Neustadt, L.L.P.

(57) ABSTRACT

According to one embodiment, a solid-state imaging device includes an imaging region including unit pixels which are two-dimensionally arranged on a semiconductor layer and each of which includes a photoelectric conversion unit and a signal scanning circuit unit. The unit pixel includes a transfer gate provided on the semiconductor layer, a photogate provided on the semiconductor layer, a first semiconductor layer of a first conductivity type, which is provided in the semiconductor layer below the photogate, and a second semiconductor layer of the first conductivity type, which is adjacent to the first semiconductor layer and provided in the semiconductor layer between the transfer gate and the photogate.

7 Claims, 12 Drawing Sheets

Example of entire arrangement
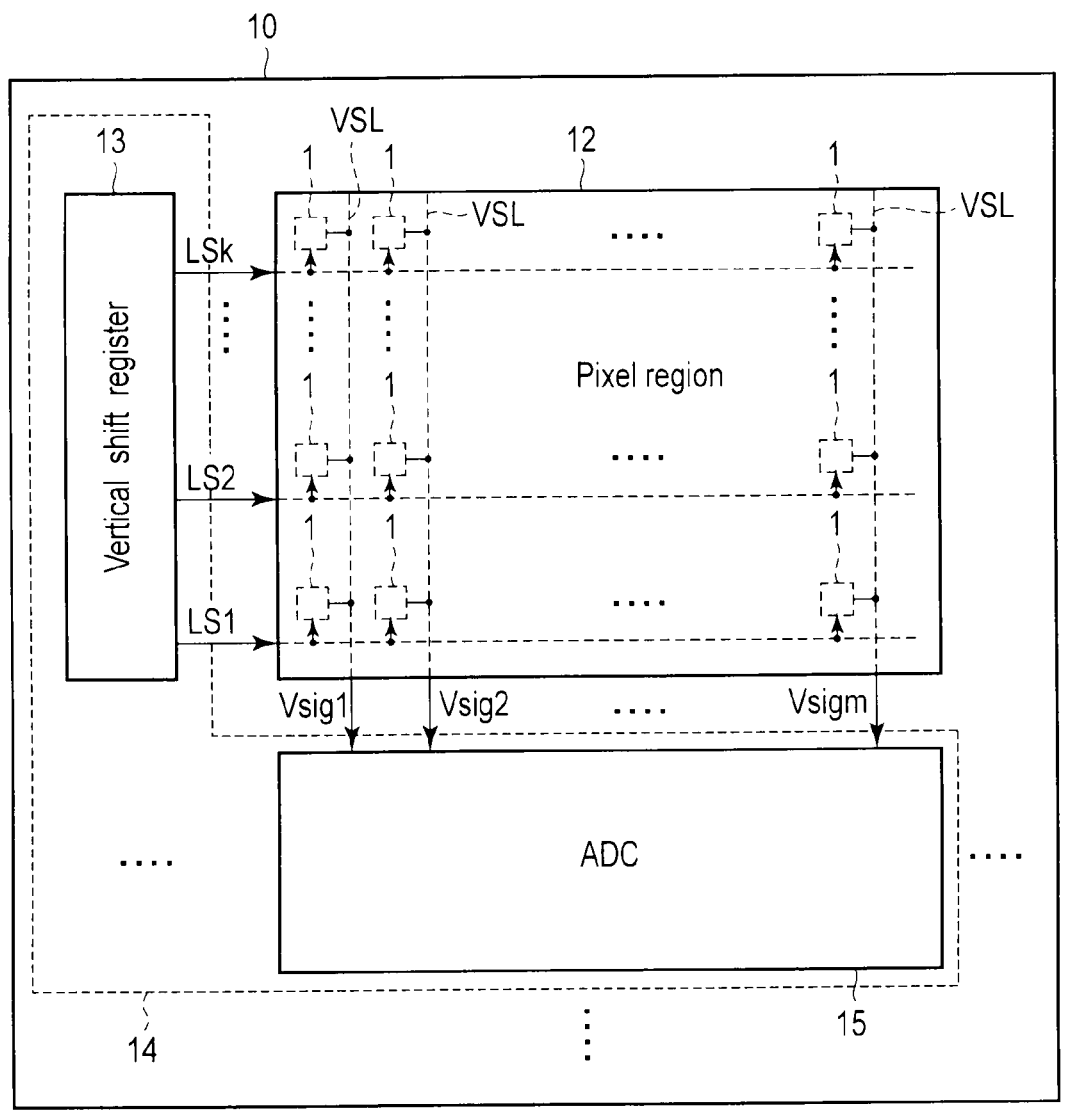
F I G. 1

Example of planar arrangement of unit pixel

Example of cross sectional arrangement

Electric potential (first embodiment)
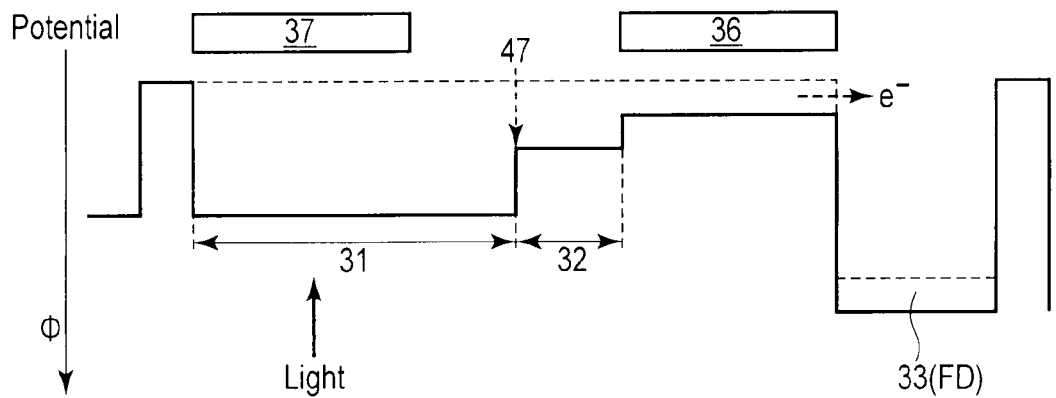
F I G. 5
Manufacturing method
F I G. 6
Formation of oxide film
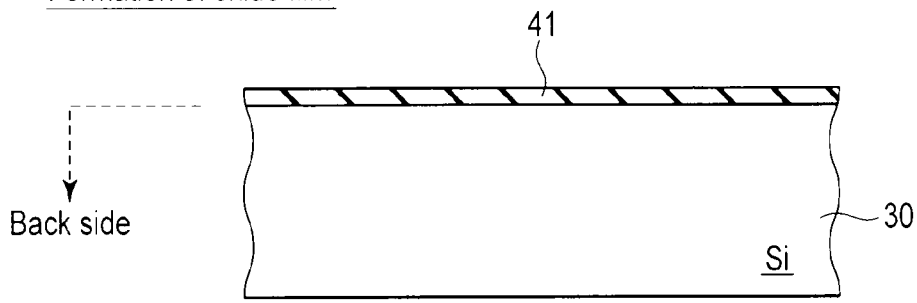
F I G. 7

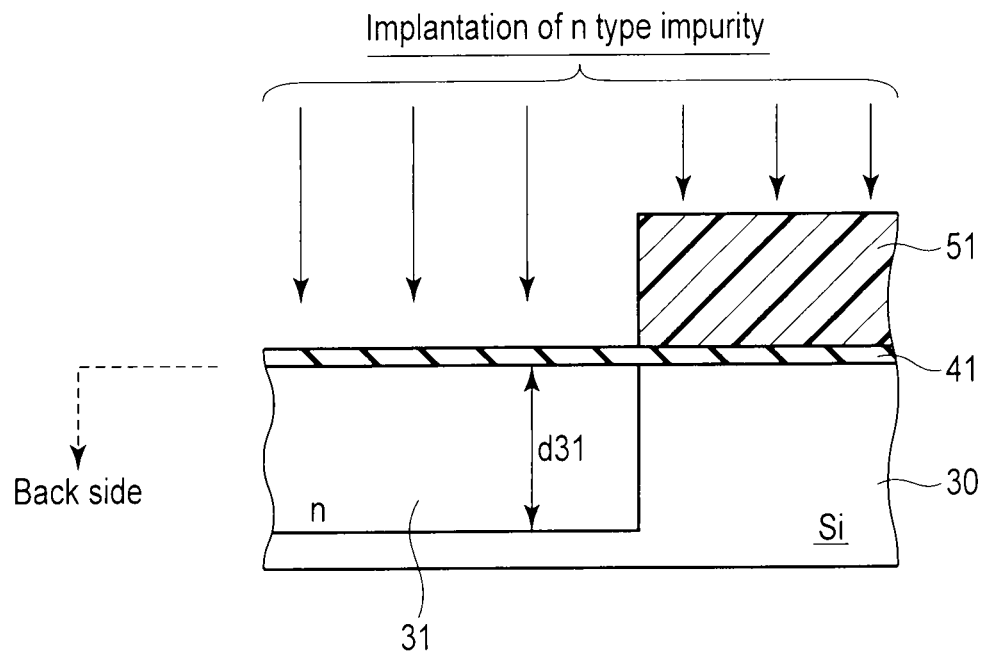
F I G. 8
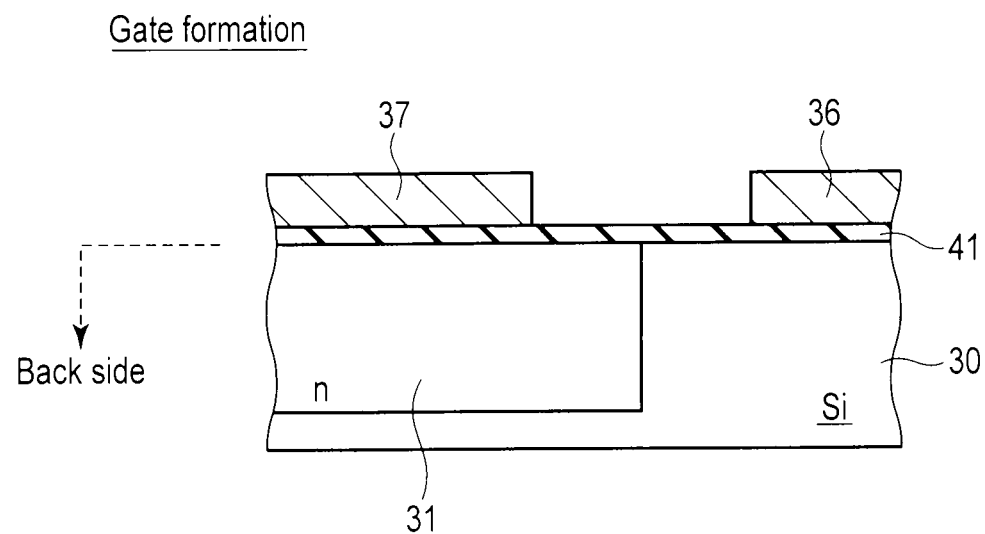
F I G. 9

Second embodiment (example of cross sectional arrangement)

Example of planar arrangement
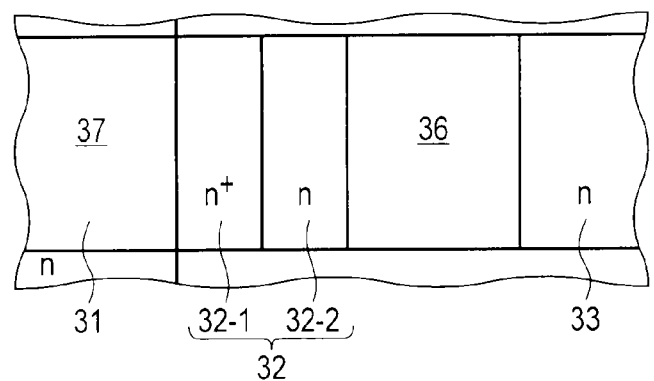
F I G. 12
Electric potential (second embodiment)
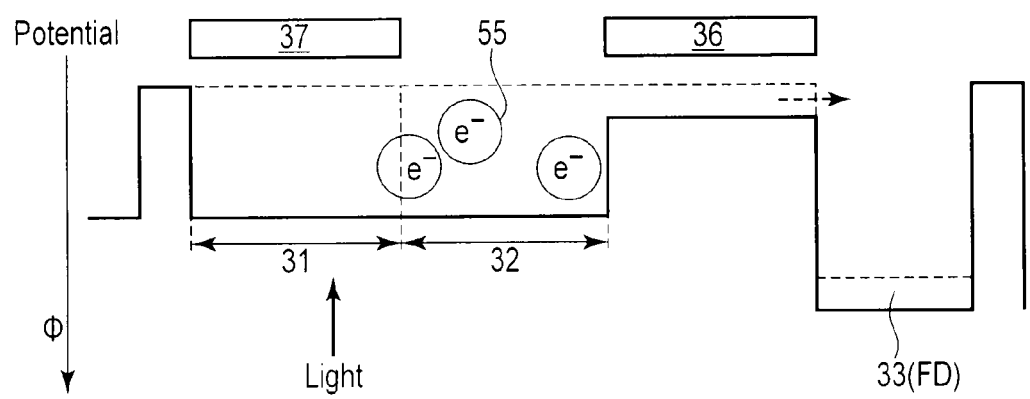
F I G. 13

Third embodiment (example of cross sectional arrangement)

Example of planar arrangement

Third embodiment

Manufacturing method (third embodiment)

Fourth embodiment
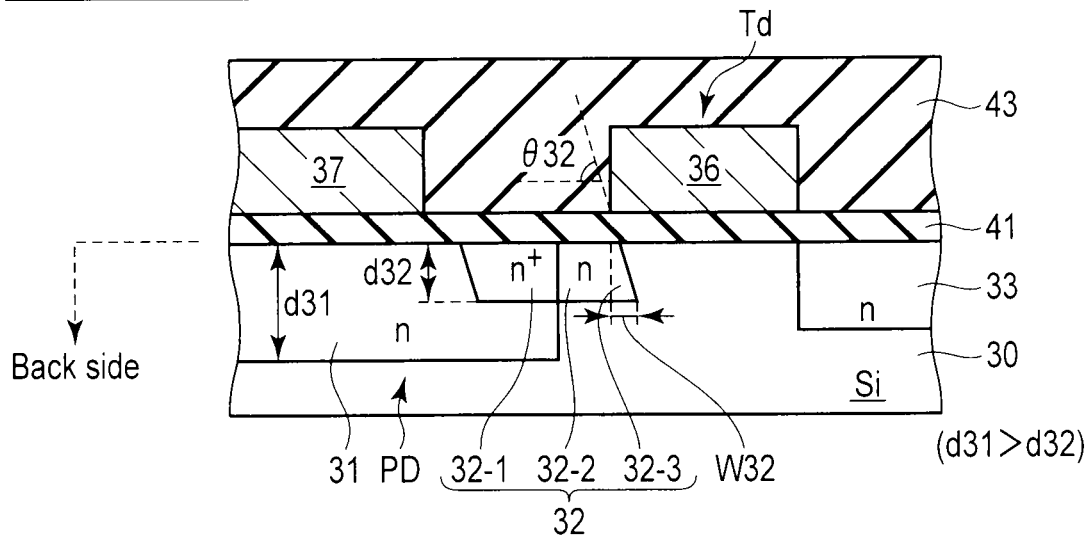
F I G. 18
Example of planar arrangement
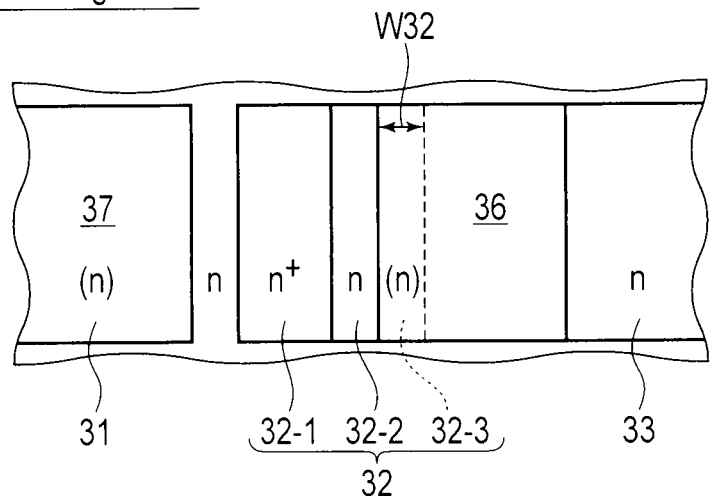
F I G. 19

Electric potential (fourth embodiment)

Comparative Example (cross sectional arrangement)

Planar arrangement

Electric potential (Comparative Example)

SOLID-STATE IMAGING DEVICE AND METHOD OF MANUFACTURING THE SAME

CROSS-REFERENCE TO RELATED APPLICATIONS

This application is based upon and claims the benefit of priority from prior Japanese Patent Application No. 2010-252905, filed Nov. 11, 2010, the entire contents of which are incorporated herein by reference.

FIELD

Embodiments described herein relate generally to a solid-state imaging device and a method of manufacturing the same.

BACKGROUND

In recent years, as pixel miniaturization has progressed, a back-side illumination type solid-state imaging device intended to increase the numerical aperture has been proposed. In the back-side illumination type solid-state imaging device, an interconnection layer is positioned on the side opposite to the light illumination surface side, so there is no need to take into consideration light reflection by the interconnection, etc. This provides a given level of freedom to design of the interconnection layer. Hence, a photogate structure mainly intended to form a pseudo conductive diffusion layer by arranging a gate interconnection on each photodiode and applying a bias to its gate has been proposed. In the above-mentioned photogate structure, an n-type impurity, for example, is implanted into a region in, for example, a semiconductor substrate, where each photodiode is to be formed, thereby forming an n-type semiconductor layer.

BRIEF DESCRIPTION OF THE DRAWINGS

FIG. 1 is a system block diagram illustrating an example of the entire arrangement of a solid-state imaging device according to the first embodiment;

FIG. 5 is a graph showing the electric potential of the unit pixel of the solid-state imaging device according to the first embodiment;

FIG. 6 is a sectional view showing a manufacturing process of the solid-state imaging device according to the first embodiment;

FIG. 7 is a sectional view showing another manufacturing process of the solid-state imaging device according to the first embodiment;

FIG. 8 is a sectional view showing still another manufacturing process of the solid-state imaging device according to the first embodiment;

FIG. 9 is a sectional view showing still another manufacturing process of the solid-state imaging device according to the first embodiment;

FIG. 12 is a plan view illustrating an example of the planar arrangement of the unit pixel of the solid-state imaging device according to the second embodiment;

FIG. 13 is a graph showing the electric potential of the unit pixel of the solid-state imaging device according to the second embodiment;

FIG. 18 is a sectional view illustrating an example of the cross-sectional arrangement of a unit pixel of a solid-state imaging device according to the fourth embodiment;

FIG. 19 is a plan view illustrating an example of the planar arrangement of the unit pixel of the solid-state imaging device according to the fourth embodiment;

DETAILED DESCRIPTION

Figure 2:
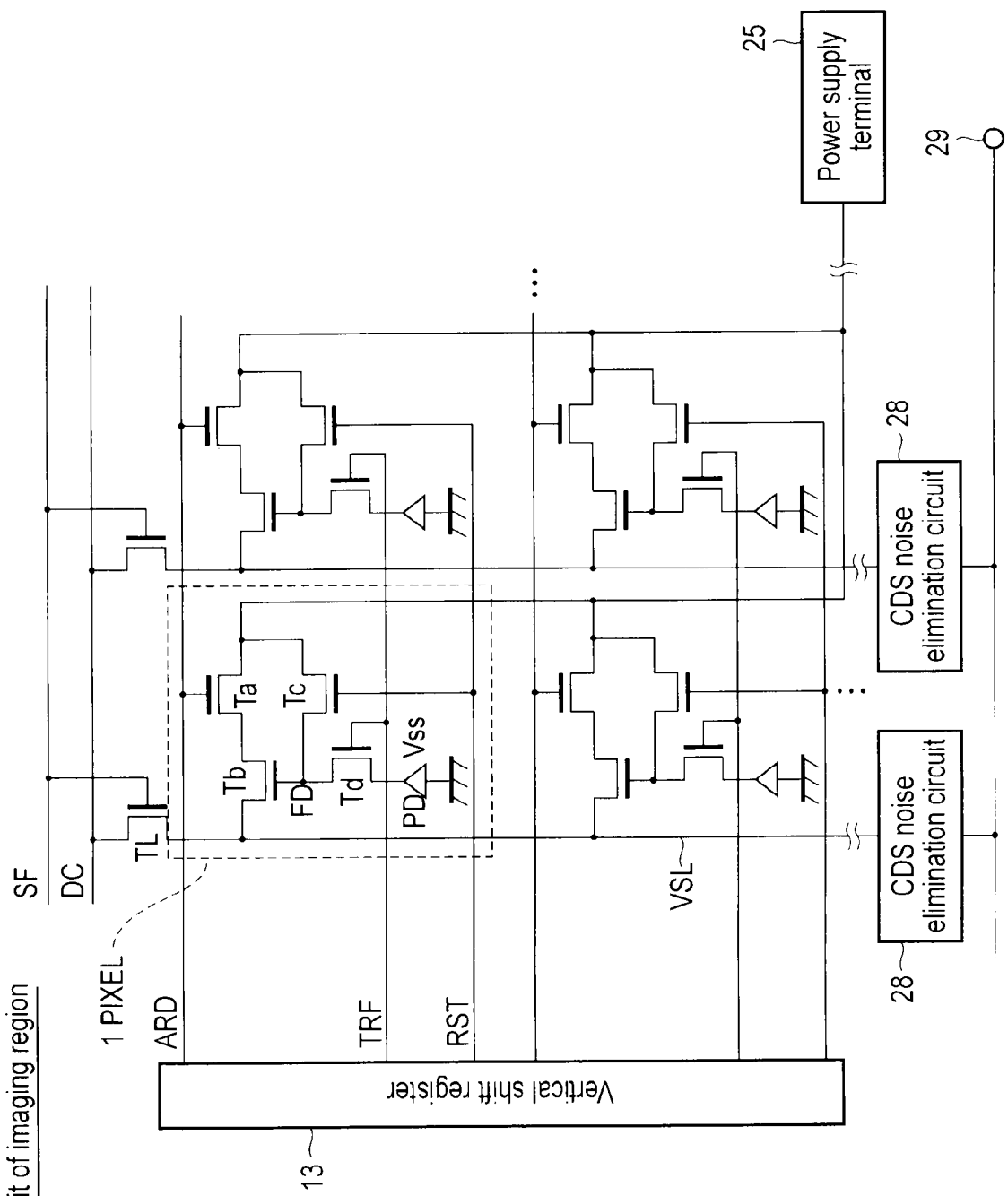
FIG. 2 is an equivalent circuit diagram showing an imaging region in FIG. 1.

In general, according to one embodiment, a solid-state imaging device including an imaging region having unit pixels which are two-dimensionally arranged on a semiconductor layer and each of which includes a photoelectric conversion unit and a signal scanning circuit unit, wherein the unit pixel includes a transfer gate provided on the semiconductor layer, a photogate provided on the semiconductor layer, a first semiconductor layer of a first conductivity type, which is provided in the semiconductor layer below the photogate, and a second semiconductor layer of the first conductivity type, which is adjacent to the first semiconductor layer and provided in the semiconductor layer between the transfer gate and the photogate.

Note that in the photogate structure, an n-type impurity, for example, is implanted into a region in, for example, a semiconductor substrate, where each photodiode is to be formed, thereby forming an n-type semiconductor layer, as described above.

However, in a process of forming an n-type semiconductor layer, a variation of the n-type semiconductor layer occurs in a region, that falls within a specific range from a desired position at which patterning is performed, due to variations in, for example, ion implantation condition and resist shape.

The area of each photodiode has a given correlation with that of the n-type semiconductor layer. Accordingly, if a variation in pattern of the n-type semiconductor layer occurs, the area of each photodiode also varies, and the number of maximum signal charges stored on the photodiode, in turn, varies.

In this manner, in the photogate structure, if a variation in position of the n-type semiconductor layer occurs, the saturation characteristic of each photodiode, the signal charge transfer performance, etc. also vary, thus degrading the pixel property.

Embodiments will now be described below with reference to the accompanying drawings. A BSI (Back-Side Illumination) type solid-state imaging device having a light illumination surface (light-receiving surface) provided on the back side of a semiconductor substrate, that is opposite to the front surface of the semiconductor substrate, on which a signal scanning circuit unit is to be formed, will be taken as an example in the embodiments to be described hereinafter. Note that in the following description, the same reference numerals denote the same parts throughout the drawings.

First Embodiment

Reduction in Variation of First Semiconductor Layer

A solid-state imaging device and a method of manufacturing the same according to the first embodiment will be described first with reference to FIGS. 1, 2, 3, 4, 5, 6, 7, 8, 9, and 10. This embodiment relates to an example in which the variation of a first semiconductor layer 31 (to be described later) is reduced.

1. Arrangement Example

An example of the arrangement of a solid-state imaging device according to the first embodiment will be described with reference to FIGS. 1, 2, 3, 4, 5, and 6.

1-1. Example of Entire Arrangement

An example of the entire arrangement of the solid-state imaging device according to this embodiment will be described first with reference to FIG. 1. An arrangement in which an A/D conversion circuit is aligned with the column position of an imaging region is shown as an example in FIG. 1.

A solid-state imaging device 10 according to this embodiment includes an imaging region 12 and driver circuit region 14, as shown in FIG. 1.

In the imaging region 12, a matrix of unit pixels (pixels) 1 each including a photoelectric conversion unit and signal scanning circuit unit is arranged on a semiconductor substrate.

The photoelectric conversion unit includes a photodiode which photoelectrically converts light into signal charges and stores them, and functions as an imaging unit. The signal scanning circuit unit includes, for example, an amplifying transistor (to be described later), and reads a signal from the photoelectric conversion unit, amplifies it, and sends it to an A/D conversion circuit 15. In this embodiment, a light illumination surface (photoelectric conversion unit) is provided on the back side of a semiconductor substrate, that is opposite to the front surface of the semiconductor substrate, on which a signal scanning circuit unit is to be formed.

The driving circuit region 14 is formed by arranging driving circuits such as a vertical shift register 13 and the A/D conversion circuit 15, which are used to drive the above-mentioned signal scanning circuit unit.

The vertical shift register 13 functions as a selection unit which outputs signals LS1 to LSk to the imaging region 12 and selects the pixels 1 for each row. The pixels 1 on the selected row output analog signals $V_{sig}$ corresponding to the amounts of incident light via vertical signal lines VSL.

The A/D conversion circuit (ADC) 15 converts the analog signals $V_{sig}$ input via the vertical signal lines VSL into digital signals.

1-2. Example of Arrangement of Imaging Region

An example of the arrangement of the imaging region 12 shown in FIG. 1 will be described next with reference to FIG. 2.

The imaging region 12 includes a plurality of pixels 1 arranged in a matrix at the intersection positions between the vertical signal lines VSL and read signal lines via which signals are read from the vertical shift register 13, as shown in FIG. 2.

The pixel 1 includes a photodiode PD, amplifying transistor Tb, transfer transistor Td, reset transistor Tc, and address transistor Ta.

In the above-mentioned arrangement of the pixel 1, the photodiode PD forms the photoelectric conversion unit. The amplifying transistor Tb, transfer transistor Td, reset transistor Tc, and address transistor Ta form the signal scanning circuit unit. Although not shown herein, the pixel 1 according to this embodiment has a photogate structure which includes a gate interconnection (photogate) arranged on the photodiode PD and applies a bias to the photogate to form a pseudo conductive diffusion layer, as will be described later.

The photodiode PD has its cathode applied with a reference ground potential $V_{SS}$.

The amplifying transistor Tb is configured to amplify and output a signal from a floating diffusion layer (floating diffusion: detection unit) FD. The amplifying transistor Tb has its gate connected to the floating diffusion layer FD, its source connected to the vertical signal line VSL, and its drain connected to the source of the address transistor Ta. Signals which are output from the pixels 1 and sent via the vertical signal lines VSL undergo noise elimination by CDS noise elimination circuits 28 and are then output from an output terminal 29.

The transfer transistor Td is configured to control storage/transfer of signal charges on/from the photodiode PD. The transfer transistor Td has its gate connected to a read signal line TRF, its source connected to the anode of the photodiode PD, and its drain connected to the floating diffusion layer FD.

The reset transistor Tc is configured to reset the gate potential of the amplifying transistor Tb. The reset transistor Tc has its gate connected to a reset signal line RST, its source connected to the floating diffusion layer FD, and its drain connected to a power supply terminal 25 connected to a drain power supply.

The address transistor Ta has its gate connected to an address signal line ADR.

A load transistor TL has its gate connected to a select signal line SF, its drain connected to the source of the amplifying transistor Tb, and its source connected to a control signal line DC.

Read Driving Operation

A read driving operation by the structure of the imaging region 12 will briefly be described hereinafter. First, address transistors Ta on a read row are turned on in accordance with a row select pulse sent from the vertical shift register 13.

Next, reset transistors Tc are turned on in accordance with a reset pulse similarly sent from the vertical shift register 13, so the voltages of amplifying transistors Tb are reset to that nearly equivalent to the potential of the floating diffusion layer FD. After that, the reset transistors Tc are turned off.

Transfer transistors Td are turned on, so signal charges stored on photodiodes PD are read to floating diffusion layers FD to modulate the potentials of the floating diffusion layers FD in accordance with the numbers of read signal charges.

Lastly, the modulated signals are read to the vertical signal lines VSL by MOS transistors which form source followers, and the read operation is thus completed.

1-3. Example of Planar Arrangement of Unit Pixel

An example of the planar arrangement of the pixel 1 will be described next with reference to FIG. 3. Note that other arrangements such as the address transistor Ta provided in the pixel 1 are not shown in FIG. 3.

Figure 3:
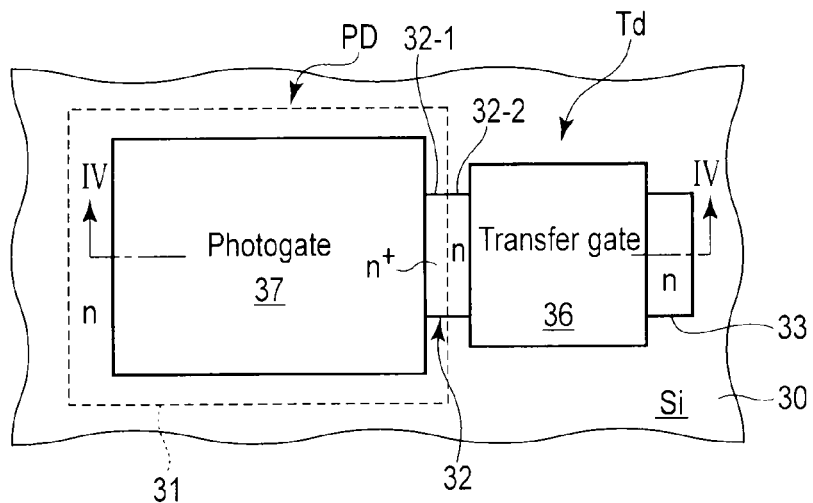
FIG. 3 is a plan view illustrating an example of the planar arrangement of a unit pixel of the solid-state imaging device according to the first embodiment.

As shown in FIG. 3, the transfer transistor Td and a photogate 37 are arranged on an Si semiconductor layer 30, a first semiconductor layer 31 is arranged below the photogate 37, and a second semiconductor layer 32 is arranged in the first semiconductor layer 31 between the transfer transistor Td and the photogate 37. A semiconductor layer 33 to serve as the source/drain of the transfer transistor Td is arranged in the first semiconductor layer 31.

The first semiconductor layer 31 is formed by, for example, an n-type impurity. Also, in this embodiment, the depth d31 of the first semiconductor layer 31 on the back side from the Si semiconductor layer 30 is larger than the depth d32 of the second semiconductor layer 32 on the back side from the Si semiconductor layer 30 (d31>d32), as will be described later.

The second semiconductor layer 32 includes an $n^+$-type semiconductor layer 32-1 which overlaps the first semiconductor layer 31 and has a relatively high impurity concentration, and an n-type semiconductor layer 32-2 having an impurity concentration lower than the $n^+$-type semiconductor layer 32-1.

The semiconductor layer 33 is formed simultaneously with the formation of the second semiconductor layer 32, as will be described later. The semiconductor layer 33 is the floating diffusion FD to serve as a charge detection unit.

1-4. Example of Cross-Sectional Arrangement of Unit Pixel

Figure 4:
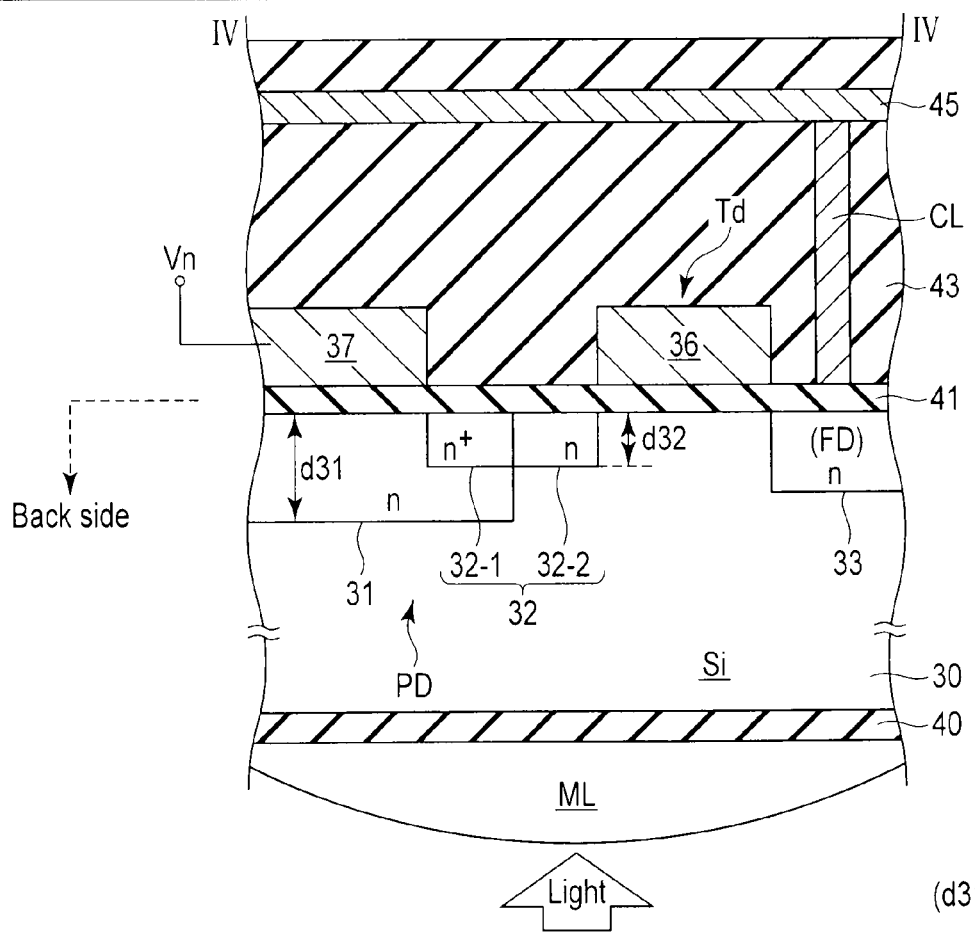
FIG. 4 is a sectional view illustrating an example of the cross-sectional arrangement of the unit pixel taken along a line IV-IV in FIG. 3.

An example of the cross-sectional arrangement of the pixel 1 taken along a line IV-IV in FIG. 3 will be described next with reference to FIG. 4. This embodiment provides a backside illumination (BSI) type solid-state imaging device having interconnection layers 45 and CL and other interconnection layers arranged on the side opposite to the light illumination surface side (back side), as shown in FIG. 4.

The transfer transistor Td includes a gate insulating film 41 provided on the Si semiconductor layer 30, a transfer gate 36 provided on the gate insulating film 41, and the n-type semiconductor layer 33 and second semiconductor layer 32 to serve as a current path.

The photogate 37 is arranged on the gate insulating film 41 formed on the photodiode PD. A bias Vn is applied to the photogate 37, thereby making it possible to form a pseudo conductive diffusion layer in the n-type first semiconductor layer 31.

The depth d31 of the first semiconductor layer 31 on the back side from the Si semiconductor layer 30 is larger than the depth d32 of the second semiconductor layer 32 on the back side from the Si semiconductor layer 30 (d31>d32).

Contact lines CL are arranged on the n-type semiconductor layer 33 and electrically connected to each other via an interconnection layer 45.

An interlayer dielectric film 43 is provided on the front side to cover the transfer transistor Td and photogate 37.

A color filter 40 is provided on the surface of the Si semiconductor layer 30 on the back side.

A macrolens ML is provided on the color filter 40. Light guided from the back side is focused on the photodiode PD by the macrolens ML.

1-5. Electric Potential of Unit Pixel

The electric potential of the pixel 1 in the charge detection unit FD will be described next with reference to FIG. 5.

In this embodiment, in the photogate structure, the n-type second semiconductor layer 32 is arranged in the Si semiconductor layer 30 between the transfer gate 36 and the photogate 37, as described above. Therefore, an electric potential region corresponding to the second semiconductor layer 32 can be formed between the transfer gate 36 and the photogate 37, as shown in FIG. 5.

Even if a boundary 47 of the n-type first semiconductor layer 31 varies from a desired position due to variations in, for example, ion implantation condition and resist shape, the variation in boundary 47 with respect to the transfer gate 36 becomes substantially greater in the second semiconductor layer 32 than in the first semiconductor layer 31, so the second semiconductor layer 32 can cancel the influence of the variation of the first semiconductor layer 31.

On the other hand, the variation in boundary of the second semiconductor layer 32 with respect to the transfer gate 36 can be reduced because the second semiconductor layer 32 is formed using two gates: the transfer gate 36 and the photogate 37 as a mask, as will be described later.

Therefore, this embodiment is advantageous in that it can reduce the variations in, for example, saturation characteristic of the photodiode PD and transfer performance of signal charges which are obtained by photoelectric conversion using the photodiode PD and transferred to the detection unit FD, thus improving the property of the pixel 1.

Moreover, the depth d31 of the first semiconductor layer 31 on the back side from the Si semiconductor layer 30 is larger than the depth d32 of the second semiconductor layer 32 on the back side from the Si semiconductor layer 30 (d31>d32).

Note that as the second semiconductor layer 32 is formed to be shallower, it becomes easier for the bias applied to the transfer gate 36 to influence the second semiconductor layer 32 and to be modulated. Hence, the depth d32 of the second semiconductor layer 32 is set smaller than the depth d31 of the first semiconductor layer 31, thereby making it possible to further reduce the variation in position at which the first semiconductor layer 31 is formed, and to easily transfer signal charges to the semiconductor layer 33 serving as the floating diffusion layer FD.

In addition, arranging the n-type second semiconductor layer 32 makes it possible to increase the area of the photodiode PD, and generating a difference in impurity concentration ($n^+$ & n types) between the two semiconductor layers 32-1 and 32-2 in the second semiconductor layer 32 makes it possible to raise the capacitance of the photodiode PD.

2. Manufacturing Method

A method of manufacturing a solid-state imaging device according to the first embodiment will be described next with reference to FIGS. 6, 7, 8, 9, and 10. A case in which the cross-sectional arrangement shown in FIG. 4 is to be manufactured will be taken as an example herein.

First, as shown in FIG. 6, an epitaxially grown Si semiconductor layer 30, for example, is arranged. Note that the Si semiconductor layer 30 is not limited to this embodiment, and can similarly use, for example, an SOI substrate, a bulk Si substrate, or an SIMOX substrate.

Next, as shown in FIG. 7, an oxide film 41 to serve as a gate insulating film is formed on the front surface of the Si semiconductor layer 30 by, for example, the thermal oxidation method.

As shown in FIG. 8, a photoresist 51 is coated on the gate insulating film 41, exposed to light, and developed, thereby allowing it to remain behind only on a region, where a transfer gate is to be formed, so that a region where a photogate is to be formed is exposed.

An n-type impurity is implanted into the Si semiconductor layer 30 by, for example, the ion implantation method using the patterned photoresist 51 as a mask to form an n-type first impurity diffusion layer 31. The photoresist 51 is then removed.

As shown in FIG. 9, polysilicon (Poly-Si), for example, is formed on the oxide film 41 using, for example, the CVD method to form a transfer gate 36 and a photogate 37 on the oxide film 41.

Figure 10:
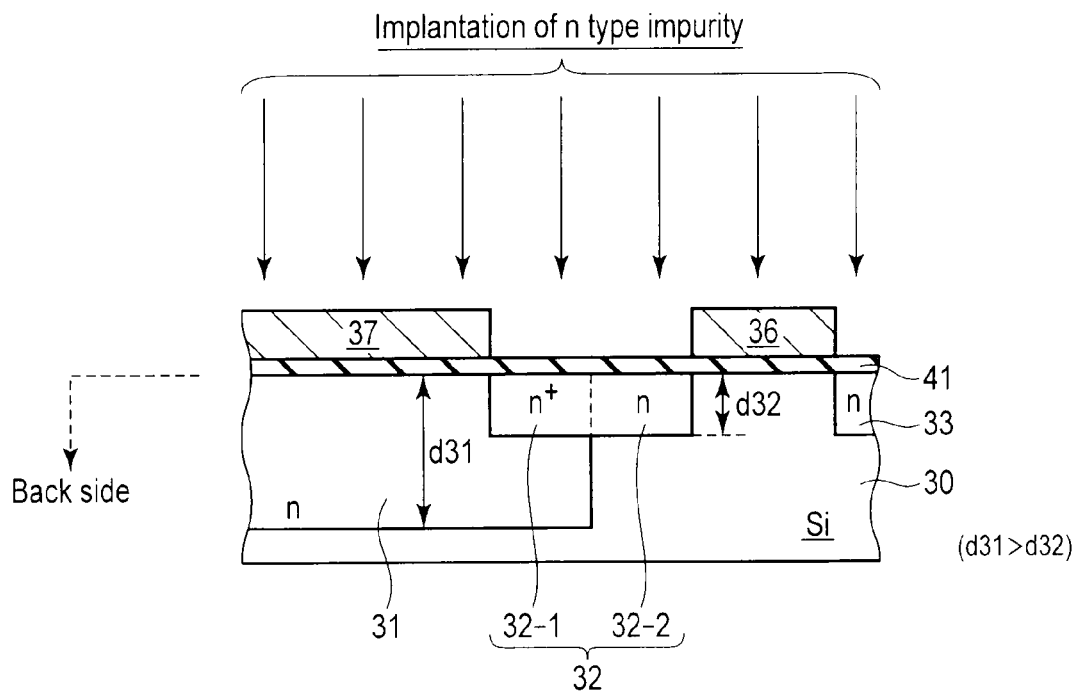
FIG. 10 is a sectional view showing still another manufacturing process of the solid-state imaging device according to the first embodiment.

As shown in FIG. 10, an n-type impurity is implanted into the Si semiconductor layer 30 using the transfer gate 36 and the photogate 37 as a mask at a depth d32 (<d31) smaller than the depth d31 of the first semiconductor layer 31, thereby simultaneously forming an n-type second impurity diffusion layer 32 and an n-type semiconductor layer 33. At this time, an $n^+$-type semiconductor layer 32-1 is formed in a portion which overlaps the first semiconductor layer 31. On the other hand, an n-type semiconductor layer 32-2 is formed in a portion where the first semiconductor layer 31 is not formed.

In this manner, since the second semiconductor layer 32 can be formed using two gates: the transfer gate 36 and the photogate 37 as a mask pattern, the variation in arrangement with respect to the transfer gate 36 can be reduced. A variation of the first semiconductor layer 31 with respect to the transfer gate 36 occurs in the second semiconductor layer 32, but the varying portion can be covered with the second semiconductor layer 32, so the variation with respect to the transfer gate 36 can become substantially greater in the second semiconductor layer 32 than in the first semiconductor layer 31. In other words, the second semiconductor layer 32 can cancel the influence of the variation of the first semiconductor layer 31.

An interlayer dielectric film 43 is formed using, for example, a silicon oxide film so as to cover the transfer gate 36 and the photogate 37, thereby forming contact lines CL and an interconnection layer 45 (not shown).

Lastly, a color filter 40 and a macrolens ML (neither is shown) are formed on the surface of the Si semiconductor layer 30 on the back side to manufacture the solid-state imaging device shown in FIG. 4.

3. Effect

Using the solid-state imaging device and the method of manufacturing the same according to this embodiment, at least the following effects (1) to (3) can be obtained:

(1) This embodiment is advantageous in that it can reduce the variations in, for example, saturation characteristic of each photodiode and signal charge transfer performance, thus improving the pixel property.

As described above, the solid-state imaging device according to this embodiment has a photogate structure in which the n-type second semiconductor layer 32 is interposed between the transfer gate 36 and the photogate 37.

Therefore, even if the boundary of the n-type first semiconductor layer 31 varies from a desired position due to variations in, for example, ion implantation condition and resist shape, the variation in boundary with respect to the transfer gate 36 can become substantially greater in the second semiconductor layer 32 than in the first semiconductor layer 31, so the second semiconductor layer 32 can cancel the influence of the variation of the first semiconductor layer 31.

This is because the variation with respect to the transfer gate 36 can be reduced as the n-type semiconductor layer 32 is formed using two gates: the transfer gate 36 and the photogate 37 as a mask.

As a result, this embodiment is advantageous in that it can reduce the variations in, for example, saturation characteristic of the photodiode PD and transfer performance of signal charges which are obtained by photoelectric conversion using the photodiode PD and transferred to the detection unit FD, thus improving the pixel property. For example, in this embodiment, an electric potential region corresponding to the second semiconductor layer 32 can be formed between the transfer gate 36 and the photogate 37, as shown in FIG. 5.

Since the influence of such a variation can be reduced, this embodiment is advantageous in commercialization and practical application.

(2) It is possible to further reduce the variation in position at which the first semiconductor layer 31 is formed, and to easily transfer signal charges to the semiconductor layer 33 serving as the floating diffusion layer FD.

Moreover, the depth d31 of the first semiconductor layer 31 on the back side from the front surface of the Si semiconductor layer 30 is larger than the depth d32 of the second semiconductor layer 32 on the back side from the front surface of the Si semiconductor layer 30 (d31>d32).

Note that as the second semiconductor layer 32 is formed to be shallower, it becomes easier for the bias applied to the transfer gate 36 to influence the second semiconductor layer 32 and to be modulated. Hence, the depth d32 of the second semiconductor layer 32 is set smaller than the depth d31 of the first semiconductor layer 31, thereby making it possible to further reduce the variation in position at which the first semiconductor layer 31 is formed, and to easily transfer signal charges to the semiconductor layer 33 serving as the floating diffusion layer FD.

(3) This embodiment is advantageous in that it can increase the area of the photodiode PD.

As described above, arranging the n-type second semiconductor layer 32 makes it possible to form the photodiode PD up to the edge of the transfer gate 36, thus increasing the area of the photodiode PD.

Also, the n-type second impurity diffusion layer 32 and the n-type semiconductor layer 33 can simultaneously be formed using the transfer gate 36 and the photogate 37 as a mask, as shown in FIG. 10. This makes it possible to reduce the number of manufacturing processes, so this embodiment is also effective in lowering the manufacturing cost.

Second Embodiment

Increase in Number of Signal Charges

A solid-state imaging device and a method of manufacturing the same according to the second embodiment will be described next with reference to FIGS. 11, 12, and 13. The second embodiment relates further to an increase in number of signal charges. The same parts as in the first embodiment will not be described in detail hereinafter.

Arrangement Example

Figure 11:
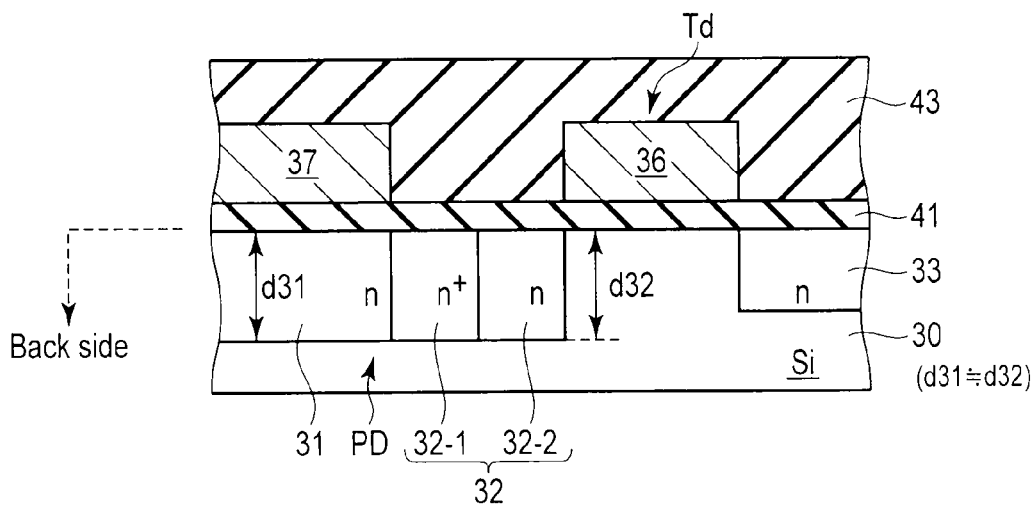
FIG. 11 is a sectional view illustrating an example of the cross-sectional arrangement of a unit pixel of a solid-state imaging device according to the second embodiment.

Examples of the cross-sectional arrangement and planar arrangement of a pixel 1 according to this embodiment are as shown in FIGS. 11 and 12, respectively.

As shown in FIGS. 11 and 12, the solid-state imaging device according to this embodiment is different from that according to the first embodiment in that in the former the depth d31 of a first semiconductor layer 31 and the depth d32 of a second semiconductor layer 32 on the back side in an Si semiconductor layer 30 are nearly equal to each other (d31≈d32). Therefore, this embodiment is advantageous in that it can increase the area of a photodiode PD, thus increasing the number of maximum signal charges.

The manufacturing method according to the second embodiment is different from that according to the first embodiment in that in the former in a process of forming the second semiconductor layer 32, the applied voltage is controlled to be higher so that an n-type impurity is implanted into the Si semiconductor layer 30 at a depth nearly equal to the depth d31 of the first semiconductor layer 31 (d31≈d32).

<Electric Potential>

The electric potential according to this embodiment is as shown in FIG. 13.

As described above, in the arrangement according to this embodiment, the depth d31 of the first semiconductor layer 31 and the depth d32 of the second semiconductor layer 32 on the back side in the Si semiconductor layer 30 are nearly equal to each other (d31≈d32).

Therefore, as is obvious from FIG. 13, this embodiment is advantageous in that it can increase the area of the photodiode PD, thus increasing the number of maximum signal charges.

<Effect>

As described above, using the solid-state imaging device and the method of manufacturing the same according to the second embodiment, at least the effects (1) to (3) as mentioned above can be obtained.

Moreover, according to this embodiment, the depth d31 of the first semiconductor layer 31 and the depth d32 of the second semiconductor layer 32 on the back side in the Si semiconductor layer 30 are nearly equal to each other (d31≈d32). Therefore, this embodiment is advantageous in that it can increase the area of the photodiode PD, thus increasing the number of maximum signal charges.

In this manner, an arrangement and manufacturing method as in this embodiment are applicable as needed.

Third Embodiment

Facilitation of Signal Charge Transfer

A solid-state imaging device and a method of manufacturing the same according to the third embodiment will be described next with reference to FIGS. 14, 15, and 16. This embodiment relates to an example of facilitation of signal charge transfer. The same parts as in the first embodiment will not be described in detail hereinafter.

Arrangement Example

Figure 14:
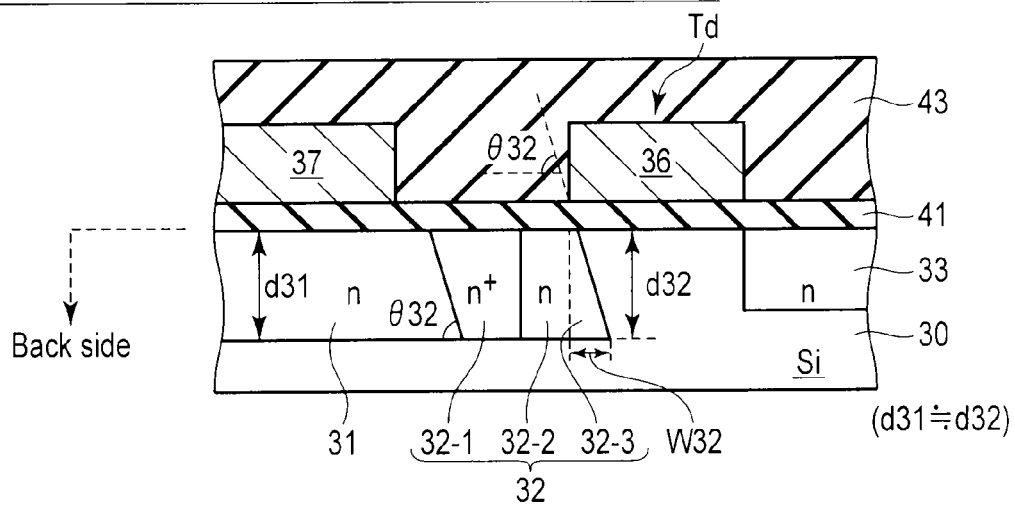
FIG. 14 is a sectional view illustrating an example of the cross-sectional arrangement of a unit pixel of a solid-state imaging device according to the third embodiment.
Figure 15:
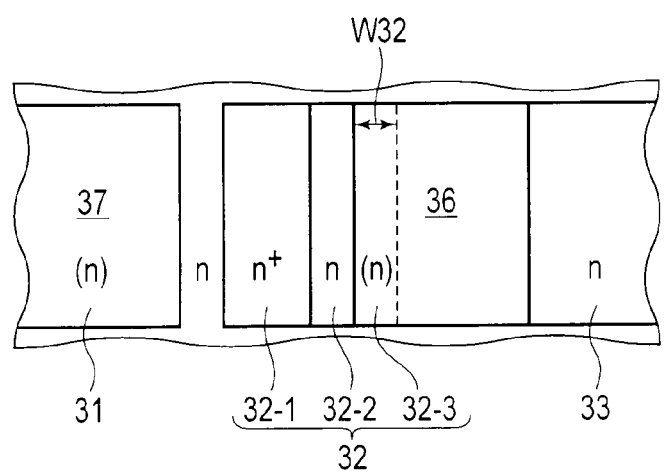
FIG. 15 is a plan view illustrating an example of the planar arrangement of the unit pixel of the solid-state imaging device according to the third embodiment.

Examples of the cross-sectional arrangement and planar arrangement of a pixel 1 according to this embodiment are as shown in FIGS. 14 and 15, respectively.

As shown in FIGS. 14 and 15, the solid-state imaging device according to this embodiment is different from those according to the above-described embodiments in that in the former a second semiconductor layer 32 is tilted from the side of a photogate 37 to a transfer gate 36 so that it has an acute angle θ32 with respect to the horizontal direction. Therefore, the second semiconductor layer 32 further includes an n-type semiconductor layer 32-3 provided below the photogate 37 to have a width W32.

<Electric Potential>

Figure 16:
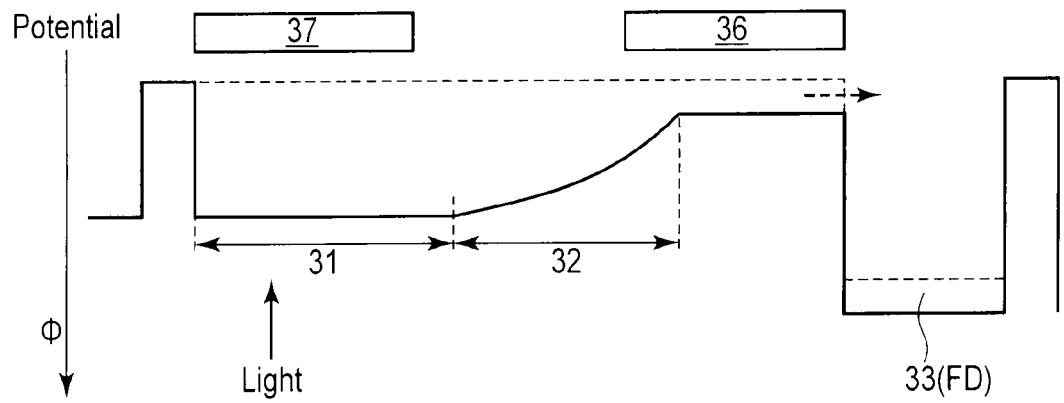
FIG. 16 is a graph showing the electric potential of the unit pixel of the solid-state imaging device according to the third embodiment.

The electric potential according to this embodiment is as shown in FIG. 16.

As described above, in the arrangement according to this embodiment, the second semiconductor layer 32 is tilted from the side of the photogate 37 to the transfer gate 36 so that it has the acute angle θ32 with respect to the horizontal direction.

Therefore, it is possible to prevent the electric potential of the pixel 1 from becoming locally high as a first semiconductor layer 31 and the second semiconductor layer 32 overlap each other due to a shadowing effect produced by the transfer gate 36 and photogate 37. In this manner, since a moderate potential distribution, as shown in FIG. 16, can be obtained, signal charges stored on a photodiode PD can smoothly move to the transfer gate 36. Also, because the n-type semiconductor layer 32-3 that is part of the second semiconductor layer 32 enters even the position below the transfer gate 36, it becomes easier for signal charges to be transferred to a diffusion layer 33 serving as a floating diffusion layer FD.

<Manufacturing Method>

Figure 17:
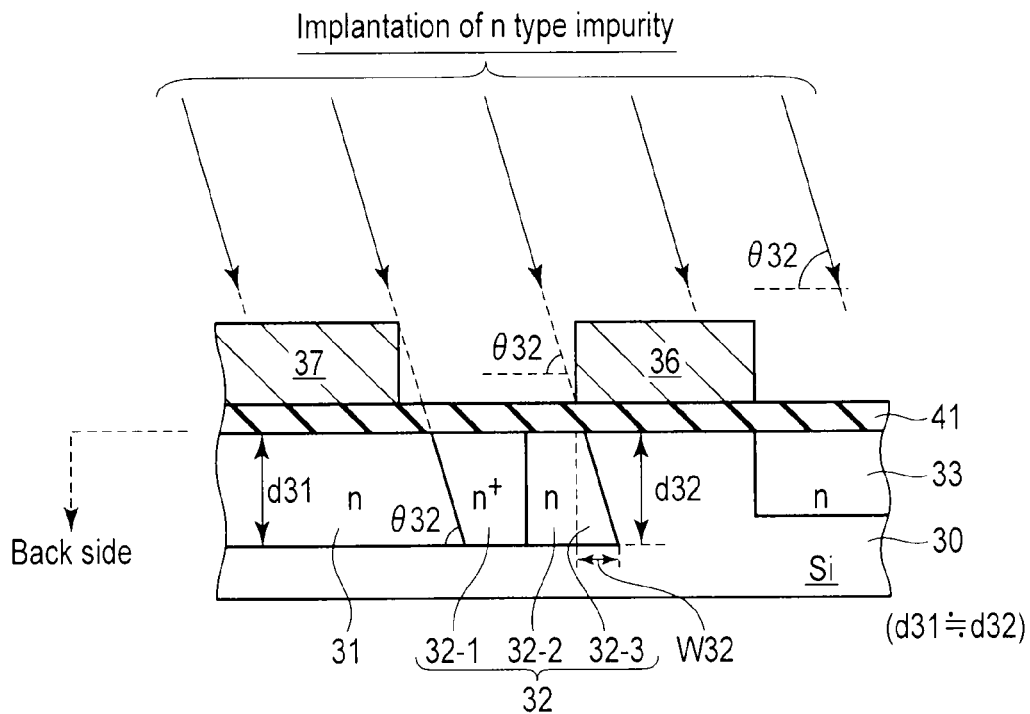
FIG. 17 is a sectional view showing a manufacturing process of the solid-state imaging device according to the third embodiment.

The manufacturing method according to the third embodiment is different from those according to the above-described embodiments in that in the former in doping an n-type impurity into an Si semiconductor layer 30 using, for example, the ion implantation method, the second semiconductor layer 32 is formed to be tilted from the side of the photogate 37 to the transfer gate 36 so that it has the acute implantation angle (tilt angle) θ32 with respect to the horizontal direction, as shown in FIG. 17.

Although the semiconductor layer 33 is formed to have a tilt angle in this process, like the second semiconductor layer 32, it is finally formed by further performing, for example, an ion implantation process, aiming at, for example, threshold adjustment. Therefore, the semiconductor layer 33 is formed with no tilt angle and therefore has the arrangement shown in FIG. 14. Also, instead of simultaneously forming the semiconductor layer 33 and the second semiconductor layer 32, the semiconductor layer 33 may be formed by ion implantation in another process using, for example, a mask, as a matter of course.

<Effect>

As described above, using the solid-state imaging device and the method of manufacturing the same according to the third embodiment, at least the effects (1) to (3) as mentioned above can be obtained.

Moreover, according to this embodiment, the second semiconductor layer 32 is tilted from the side of the photogate 37 to the transfer gate 36 so that it has the acute angle θ32 with respect to the horizontal direction.

Therefore, it is possible to prevent the electric potential of the pixel 1 from becoming locally high as the first semiconductor layer 31 and the second semiconductor layer 32 overlap each other due to a shadowing effect produced by the transfer gate 36 and photogate 37. In this manner, since a moderate potential distribution can be obtained, this embodiment is advantageous in that signal charges stored on the photodiode PD can smoothly move to the transfer gate 36.

Also, because the n-type semiconductor layer 32-3 that is part of the second semiconductor layer 32 enters even the position below the transfer gate 36, this embodiment is advantageous in that it becomes easier for signal charges to be transferred to the diffusion layer 33 serving as the floating diffusion layer FD.

In this manner, an arrangement and manufacturing method as in this embodiment are applicable as needed.

Fourth Embodiment

Reduction in Variation and Rise in Capacitance of Photodiode

A solid-state imaging device and a method of manufacturing the same according to the fourth embodiment will be described next with reference to FIGS. 18, 19, and 20. This embodiment relates to a reduction in variation and a rise in capacitance of a photodiode. The same parts as in the above-described embodiments will not be described in detail hereinafter.

Arrangement Example

Examples of the cross-sectional arrangement and planar arrangement of a pixel 1 according to this embodiment are as shown in FIGS. 18 and 19, respectively.

As shown in FIGS. 18 and 19, the solid-state imaging device according to this embodiment is different from the third embodiment in that in the former the depth d31 of a first semiconductor layer 31 on the back side from an Si semiconductor layer 30 is larger than the depth d32 of a second semiconductor layer 32 on the back side from the Si semiconductor layer 30 (d31>d32).

Note that the fourth embodiment is the same as in the third embodiment in that the second semiconductor layer 32 is tilted from the side of a photogate 37 to a transfer gate 36 so that it has an acute angle θ32 with respect to the horizontal direction.

<Electric Potential>

Figure 20:
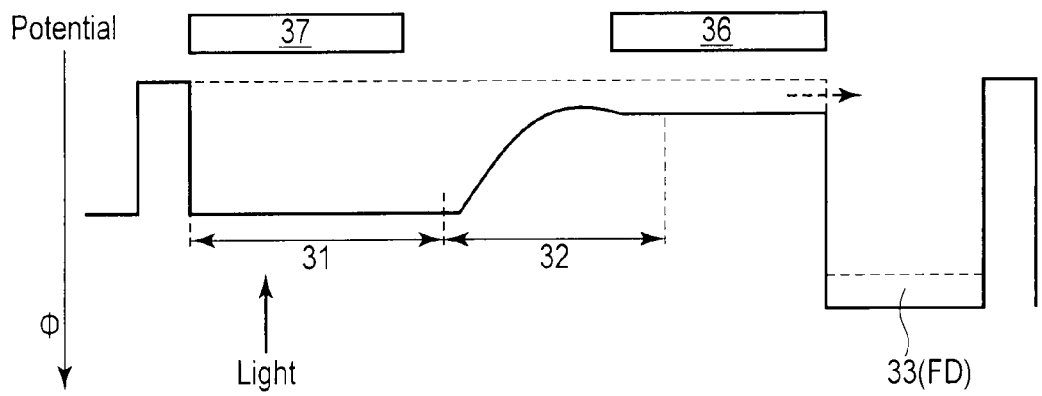
FIG. 20 is a graph showing the electric potential of the unit pixel of the solid-state imaging device according to the fourth embodiment.

The electric potential according to this embodiment is as shown in FIG. 20.

As described above, in the arrangement according to this embodiment, the depth d31 of the first semiconductor layer 31 on the back side from the Si semiconductor layer 30 is larger than the depth d32 of the second semiconductor layer 32 on the back side from the Si semiconductor layer 30 (d31>d32).

Therefore, as shown in FIG. 20, this embodiment is advantageous in that the second semiconductor layer 32 becomes more susceptible to the voltage applied to the transfer gate 36, thus making it possible to easily transfer signal charges to a diffusion layer 33 serving as a floating diffusion layer FD.

According to the manufacturing method of the fourth embodiment, in doping an n-type impurity into the Si semiconductor layer 30 using, for example, the ion implantation method, the applied voltage is controlled to be lower than in the third embodiment, so the second semiconductor layer 32 is formed to be tilted from the side of the photogate 37 to the transfer gate 36 so that it has the acute implantation angle (tilt angle) θ32 with respect to the horizontal direction.

<Effect>

As described above, using the solid-state imaging device and the method of manufacturing the same according to the fourth embodiment, at least the effects (1) to (3) as mentioned above can be obtained.

Moreover, according to this embodiment, the depth d31 of the first semiconductor layer 31 on the back side from the Si semiconductor layer 30 is larger than the depth d32 of the second semiconductor layer 32 on the back side from the Si semiconductor layer 30 (d31>d32).

Therefore, this embodiment is advantageous in that the second semiconductor layer 32 becomes more susceptible to the voltage applied to the transfer gate 36, thus making it possible to easily transfer signal charges to the semiconductor layer 33 serving as the floating diffusion layer FD.

This embodiment is additionally advantageous in that the depth d32 of the second semiconductor layer 32 is relatively small, so it is possible to raise the PN junction capacitance of a photodiode PD, thus increasing the number of signal charges that can be stored on the photodiode PD.

Comparative Example

To make a comparison with the first to fourth embodiments, a solid-state imaging device and a method of manufacturing the same according to a Comparative Example will be described next with reference to FIGS. 21, 22, and 23. The same parts as in the first embodiment will not be described in detail hereinafter.

Arrangement Example

Figure 21:
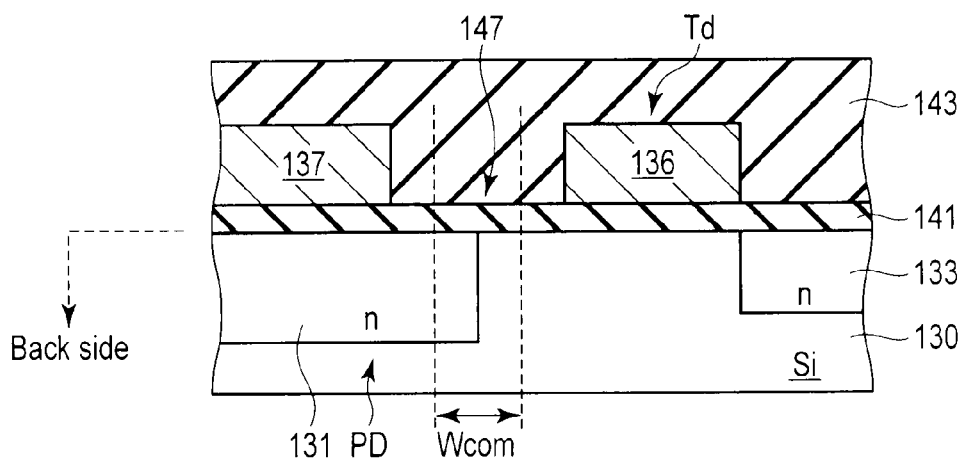
FIG. 21 is a sectional view illustrating an example of the cross-sectional arrangement of a unit pixel of a solid-state imaging device according to a Comparative Example.
Figure 22:
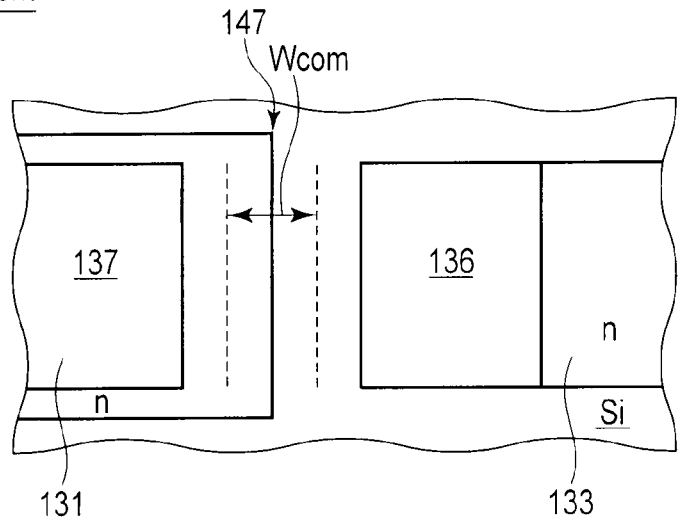
FIG. 22 is a plan view illustrating an example of the planar arrangement of the unit pixel of the solid-state imaging device according to the Comparative Example.

As shown in FIGS. 21 and 22, the solid-state imaging device according to the Comparative Example is different from those according to the above-described embodiments in that an n-type semiconductor layer 131 is arranged below a photogate 137, and no impurity semiconductor layer is interposed between a transfer gate 136 and the photogate 137.

According to the manufacturing method of the Comparative Example, patterning is performed such that a surface defining a region where a photodiode PD is to be formed is exposed, and the remaining region is masked using a photoresist. An n-type impurity is ion-implanted into an Si semiconductor layer 130 using an accelerator to form an n-type semiconductor layer 131.

However, in this process of forming the n-type semiconductor layer 131, a variation occurs in a predetermined range Wcom from a position 147 of the patterned edge due to variations in, for example, ion implantation condition and photoresist shape.

<Electric Potential>

Figure 23:
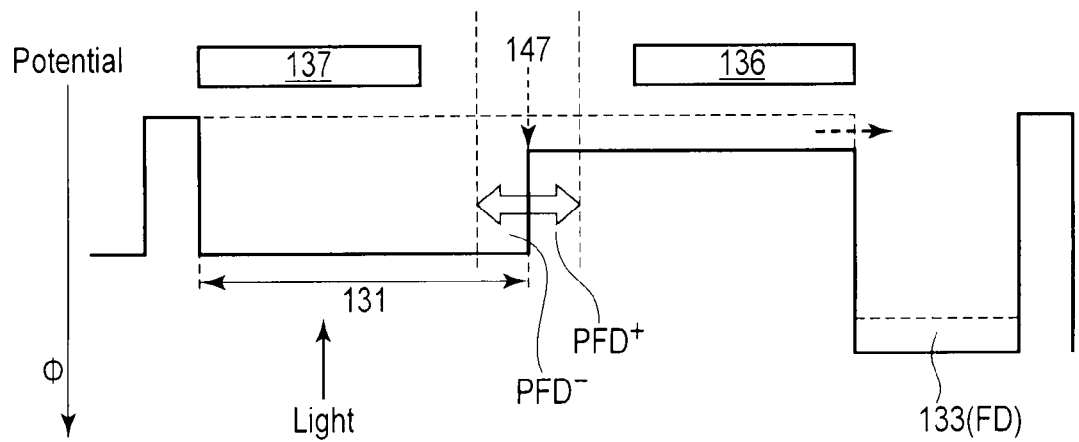
FIG. 23 is a graph showing the electric potential of the unit pixel of the solid-state imaging device according to the Comparative Example.

The electric potential according to the Comparative Example is as shown in FIG. 23.

As shown in FIG. 23, if, for example, the position 147 of the edge of the n-type semiconductor layer 131 varies farther from the transfer gate 136 (PFD⁻), the n-type semiconductor layer 131 and the transfer gate 136 separate from each other, and this makes it difficult to transfer signal charges stored on the photodiode PD to a diffusion layer 33 serving as a floating diffusion layer FD. In addition, the area of the photodiode PD is proportional to that of the n-type semiconductor layer 131. Hence, again, if the n-type semiconductor layer 131 varies farther from the transfer gate 136, the area of the photodiode PD disadvantageously reduces, thus decreasing the number of storable maximum signal charges.

On the other hand, if the position 147 of the edge of the n-type semiconductor layer 131 varies closer to the transfer gate 136 (PFD⁺), the n-type semiconductor layer 131 and the transfer gate 136 come closer to each other, and this makes it easy to transfer signal charges to the semiconductor layer 33 serving as the floating diffusion layer FD, thus allowing the number of storable maximum signal charges to be larger than expected.

In this manner, if a variation in pattern position of the n-type semiconductor layer 131 with respect to the transfer gate 136 occurs, the area of the photodiode PD also varies, and the number of maximum signal charges stored on the photodiode PD, in turn, varies, thus degrading the pixel property.

In addition, unless the influence of such a variation is reduced, this Comparative Example is disadvantageous in practical application because there is no hope of commercialization.

Note that the above-described embodiments have been explained by taking as an example an arrangement in which each pixel 1 includes four transistors in FIG. 2. However, the present invention is not limited to this arrangement, and is applicable as needed to, for example, an arrangement in which each pixel 1 includes three transistors, excluding the address transistor Ta, as a matter of course. Further, although the above-described embodiments have been explained by taking as an example an arrangement in which the macrolens ML is provided in correspondence with a set of semiconductor layers 31 to 33 in FIG. 4, the present embodiments are not limited to this. The present embodiments can take any form as long as the macrolens ML is provided in the region corresponding to at least the first semiconductor layer 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising an imaging region including unit pixels which are two-dimensionally arranged on a semiconductor layer and each of which includes a photoelectric conversion unit and a signal scanning circuit unit, wherein
   the unit pixels comprise:
   a transfer gate provided on the semiconductor layer;
   a photogate provided on the semiconductor layer;
   a first semiconductor layer of a first conductivity type, which is provided in the semiconductor layer below the photogate; and
   a second semiconductor layer of the first conductivity type, which is adjacent to the first semiconductor layer and provided in the semiconductor layer between the transfer gate and the photogate.

2. The solid-state imaging device of claim 1, wherein a depth of the first semiconductor layer from a front surface of the semiconductor layer is larger than a depth of the second semiconductor layer from the front surface of the semiconductor layer.

3. The solid-state imaging device of claim 1, wherein a depth of the first semiconductor layer from a front surface of the semiconductor layer is nearly equal to a depth of the second semiconductor layer from the front surface of the semiconductor layer.

4. The solid-state imaging device of claim 1, wherein the second semiconductor layer includes a first semiconductor region of the first conductivity type, which overlaps the first semiconductor layer and has an impurity concentration higher than the first semiconductor layer, and a second semiconductor region of the first conductivity type, which has an impurity concentration lower than the first semiconductor region.

5. The solid-state imaging device of claim 1, wherein the second semiconductor layer is tilted from a side of the photogate to the transfer gate so that the second semiconductor layer has an acute angle with respect to a horizontal direction.

6. The solid-state imaging device of claim 5, wherein the second semiconductor layer further includes a third semiconductor region of the first conductivity type, which is provided in the semiconductor layer below the transfer gate so as to be adjacent to the second semiconductor region.

7. The solid-state imaging device of claim 1, wherein the solid-state imaging device comprises a back-side illumination type solid-state imaging device having a light-receiving surface provided on a back side opposite to a front surface of the semiconductor layer, on which the signal scanning circuit unit is to be formed.

* * * * *